(12) United States Patent
Watson

(10) Patent No.: US 6,840,638 B2
(45) Date of Patent: Jan. 11, 2005

(54) DEFORMABLE MIRROR WITH PASSIVE AND ACTIVE ACTUATORS

(75) Inventor: Douglas C. Watson, Campbell, CA (US)

(73) Assignee: Nikon Corporation, Tokyo (JP)

(*) Notice: Subject to any disclaimer, the term of this patent is extended or adjusted under 35 U.S.C. 154(b) by 68 days.

(21) Appl. No.: 10/445,867

(22) Filed: May 28, 2003

(65) Prior Publication Data

US 2004/0027632 A1 Feb. 12, 2004

Related U.S. Application Data

(60) Provisional application No. 60/393,092, filed on Jul. 3, 2002.

(51) Int. Cl.[7] .............................................. G02B 7/182
(52) U.S. Cl. ...................................... 359/849; 359/846
(58) Field of Search .................................. 359/212, 223, 359/224, 198, 846–849, 872, 900, 290, 291; 310/90, 311, 328

(56) References Cited

U.S. PATENT DOCUMENTS

| | | |
|---|---|---|
| 4,655,563 A | 4/1987 | Plante et al. |
| 4,950,878 A | 8/1990 | Ulich et al. |
| 4,967,063 A | 10/1990 | Wang et al. |
| 5,420,436 A | 5/1995 | Seya et al. |
| 5,687,566 A | 11/1997 | Petty |
| 5,745,309 A | 4/1998 | Salmon |
| 5,815,310 A | 9/1998 | Williamson |
| 5,912,731 A | 6/1999 | DeLong et al. |
| 6,398,373 B1 * | 6/2002 | Guzman et al. ............ 359/846 |

OTHER PUBLICATIONS

Ealey; "Active and Adaptive Optical Components; The Technology and Future Trends"; SPIE vol. 1543 Active and Adaptive Optical Components, 1991; pp. 2–34.

Ealey; "Actuators: Design Fundamentals, Key Performance Specifications, and Parametric Trades"; SPIE vol. 1543 Active and Adaptive Optical Components, 1991; pp. 346–362.

Ealey et al.; "Deformable Mirrors: Design Fundamentals, Key Performance Specifications, and Parametric Trades"; SPIE vol. 1543 Active and Adaptive Optical Components, 1991; pp. 36–51.

* cited by examiner

Primary Examiner—James Phan
(74) Attorney, Agent, or Firm—Whitham, Curtis & Christofferson, P.C.

(57) ABSTRACT

A combination of active and passive force actuators provide adjustments to the shape of an optical element to reduce or compensate for aberrations in an optical system. Passive actuators at a high spatial frequency are capable of correcting higher order steady state components of shape error while dynamic corrections of higher frequency, operationally dependent is provided allowing the number of active actuators and the power supplied to each active actuator to be reduced; reducing heating of the optical element by the active actuators and increasing stability of the system. Compound actuators including a combination of an active actuator portion with a passive actuator portion (which provides a mechanical force bias to the active actuator portion) allows increased spatial flexibility of application of forces to the optical element and other advantages.

18 Claims, 2 Drawing Sheets

DEFORMABLE MIRROR WITH PASSIVE AND ACTIVE ACTUATORS

CROSS-REFERENCE TO RELATED APPLICATIONS

This application claims priority of U.S. Provisional Patent Application Ser. No. 60/393,092, filed Jul. 3, 2002, entitled "Deformable Mirror with Passive and Active Actuators" which is hereby fully incorporated by reference.

BACKGROUND OF THE INVENTION

1. Field of the Invention

The present invention generally relates to high precision imaging using a reflective optical element and, more particularly, to high precision lithography exposure systems and methods using one or more adaptive, reflective optical elements to minimize aberrations and measurement and control therefor which is controlled by a combination of passive and active actuators.

2. Description of the Prior Art

Many manufacturing and scientific processes require the use of optical systems having extremely high accuracy and precision and freedom from aberrations as well as the ability to make observations and/or exposures in wavelength regimes well outside the visible spectrum. For example, at least one lithographic exposure process is invariably required for establishing the location and basic dimensions of respective electrical or electronic elements in semiconductor integrated circuits in which the number of such elements on a single chip can extend into the tens if not hundreds of millions. The respective electrical or electronic elements can be very small and placement in close proximity, sometimes referred to as high integration density, is highly desirable in order to reduce signal propagation time and susceptibility to noise as well as to achieve other advantages such as increased functionality and, in some cases, manufacturing economy. These circumstances provide strong incentives to develop smaller minimum feature size regimes which must be established through lithographic exposures of a resist. Therefore, resolution and aberration of the exposure must be held within a very closely defined budget which is a small fraction of the minimum feature size.

The resolution of any optical system is a function of the wavelength of the energy used for the exposure although some arrangements such as phase-shift masks have allowed exposure resolution to be extended below the wavelength of the exposure radiation. Nevertheless, resolution of extremely small features requires correspondingly short wavelengths of radiation. Accordingly, use of X-rays for lithographic exposure are known but not widely used due to the requirement for fabrication of an exposure mask at the same minimum feature size as the final desired pattern since reduction of the size of the pattern cannot be achieved with X-rays. Optical and electron beam projection systems, however, can achieve such image pattern size reduction in the exposure pattern relative to feature sizes in a reticle which establishes the pattern to be exposed. However, between these two techniques, reticles for electron beam projection are generally far more expensive than optical reticles and, perhaps more importantly, require many more exposures to form a complete integrated circuit pattern since the exposure field at the chip is comparatively more limited in electron beam projection systems. Therefore, there is substantial continued interest in optical lithographic exposure systems and extending their capabilities to shorter wavelengths, such as extreme ultraviolet (EUV).

EUV wavelengths are generally considered to be in the range of about 12 to 14 nanometers and more specifically within a range of less than one nanometer in a band centered on approximately 13 nanometers. At such wavelengths, most imaging materials which are transparent in the visible spectrum and which are suitable for lenses are substantially opaque to the imaging radiation. Therefore, optical systems have been developed and are known which have only reflective elements. Such fully reflective systems are usually more complex than lens systems since interference between illumination of the reticle and illumination of the target with the projected pattern must be avoided. While the number of reflective elements in such lens systems are generally fewer than the number of elements in comparable refractive lens systems, reflective surfaces are much more sensitive to surface aberrations and the freedom from aberrations maintained or well-corrected throughout the entire optical system. The maintenance of high manufacturing yield in the above-discussed exemplary environment thus requires not only high stability of the optical system but frequent measurement and adjustment to assure an adequately high level of optical performance of the system.

While techniques of measurement of wave-front aberrations are well-known and sufficient to accurately characterize the performance of optical systems and elements thereof, practical arrangements for conducting such measurements are difficult and complex. For instance, measurements cannot be made on axis or within the exposure/projection field during an exposure without interference with that exposure (e.g. by casting shadows or otherwise occupying a portion of the focal plane of the system where the target is located). Measurements performed between exposures cannot be regarded as measurements of optical performance during the exposure, itself, and do not directly characterize the lithographic image, but are often the only practical solution at the current state of the art even though sources of error may be introduced. Optical performance generally degrades with increasing distance from the optical axis of the system and, as a practical matter, it is desirable to use as much of the field where sufficient precision, resolution and freedom from aberrations can be maintained for projection of the desired image; generally precluding such measurements which, in any event, may not directly or even predictably correspond to the on-axis performance of the element or system.

Active optics are known but have not been widely used to date. Active optics involve the ability to change the overall or local shape of optical elements to alter the optical properties of the element. The article "Active Optics: A New Technology for the Control of Light" by John W. Hardy, Proc. of the IEEE, Vol 66, No. 6, June, 1978, provides an overview of this technology and is hereby fully incorporated by reference. In particular, some general suggestions are made for provision of mechanical arrangements for achieving localized or generalized deformations of reflecting optical elements to achieve different optical effects such as compensating for atmospheric turbulence. Nevertheless, measurement to achieve any particular optical effect remains extremely complex and difficult as discussed therein and the deformation of optical elements is limited and difficult to control, particularly when it is considered that deformations can be comprised of multiple components which may be relatively difficult to distinguish and which may take many different forms which are difficult to characterize. For example, some relatively large components of deformation of an optical element may be caused by manufacturing variations and/or mounting arrangements while some relatively smaller and generally more localized components of deformation may be due to thermal effects including but not limited to irregular absorption of radiation in accordance with the projected pattern. Further, it should be recognized that the corrections needed may be substantially less than the wavelength of imaging radiation, which, itself, may be very short to achieve adequate resolution but may be as much as several orders of magnitude larger.

Additionally, localized corrections may be necessary for relatively small areas of the optical element, particularly to compensate for higher-order aberrations which generally tend to be an incident of manufacturing variations and/or mounting imperfections but may correspond to localized thermal heating from absorption of patterned exposure radiation. Further, it is generally desirable for the optical elements to be relatively stiff and thick to provide significant thermal mass and stability; requiring significant power or force to achieve localized shape correction while the size of actuators must be correspondingly limited although the force available therefrom must be relatively large. The actuators themselves may thus become a localized heat source that complicates correction particularly as the numbers thereof are increased in order to provide correction of aberrations through high order aberrations.

SUMMARY OF THE INVENTION

The present invention is thus intended to provide an arrangement which allows correction of optical element aberrations through relatively high order aberrations with a limited number of small and relatively low power actuators while providing for dynamic correction of time-varying aberrations.

In order to accomplish these and other objects of the invention, a dynamically adjustable optical element and lens system including such an optical element is provided including, in combination, a reaction plate, a mirror mounted on but spaced from the reaction plate, and a plurality of passive force actuators and a plurality of active force actuators arrayed across the reaction plate for applying forces between the reaction plate and the mirror.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
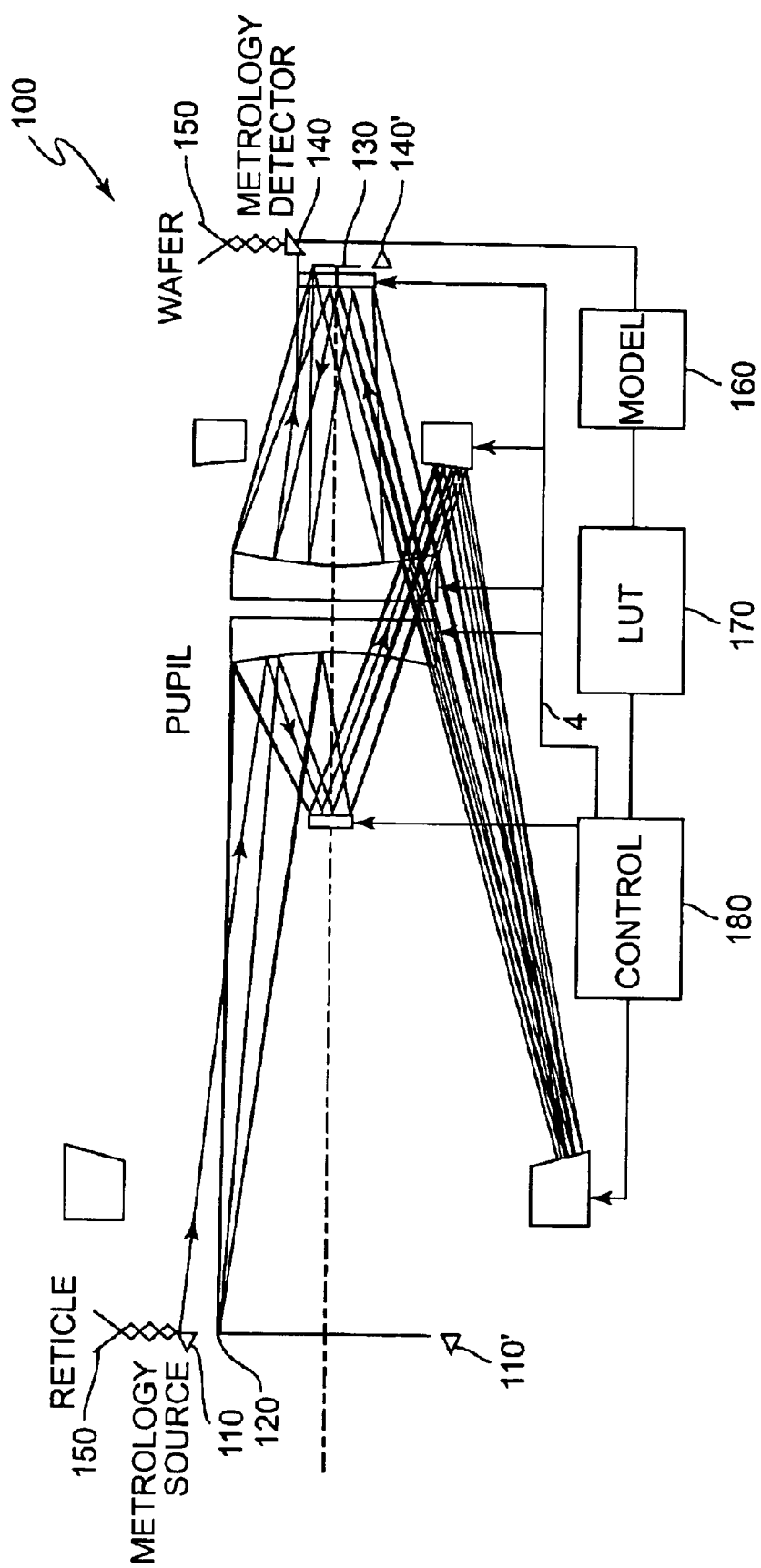
FIG. 1 is a schematic diagram of an adaptive catoptic lens system with which the invention is advantageously employed.

Referring now to the drawings, and more particularly to FIG. 1, there is shown an exemplary catoptic lens system (sometimes referred to as a catoptric lens system) with which the invention may be employed. All optical elements of this lens system are reflective and thus the lens system is suitable for projection of EUV wavelengths or in any reflective element of any lens system. The illustrated optical system is suitable for image projection of a pattern established by the reticle onto a target such as a resist-coated wafer. It should be further noted that this optical system is relatively complex; including six mirrors and having a tortuous optical path among the elements (some of which must be annular or a segment of an annulus) and which is principally off-axis which, itself, may give rise to significant aberrations.

In accordance with the invention, adaptive optics may be employed for any or all elements of the optical system of FIG. 1 or any similar system having reflectors for all elements thereof and thus capable of projecting an image using EUV radiation or, for longer wavelengths, having a reflector for any optical element. However, it is necessary to provide for measurements of any existing aberrations at least periodically (e.g. possibly as infrequently as once per week for measurement of total aberration) such that corrective action can be taken to adjust the adaptive optic to reduce aberrations to an allowable amount.

The metrology system in accordance with the invention is installed as part of the projection lens. A light source 110, possibly with a wavelength different from the exposure wavelength (as is possible since no optical elements are refractive) is preferably situated slightly off-axis and outside reticle 120, which is illuminated by a light (e.g. EUV) source and provides the exposure light pattern imaged by the optical system 100. Because the metrology light source 110 is off-axis and preferably outside reticle 120 and the target/wafer 130 generally corresponds with the area of at least a portion of the reticle, the output metrology beam will be in a different location from the wafer being exposed. Therefore, it is possible to locate a sensor 140 at the output location and to measure the aberration during exposure and without significant interruption of the exposure process.

Accordingly, proper conditions of exposure may be fully or substantially maintained during measurement. It is also possible to sample a portion of the metrology output (e.g. using source 110' and detector 140' at different and/or additional locations and/or providing for movement of the metrology source and detector to and away from their operative locations or even to locations within the reticle area, as schematically depicted at 150) during changes or alignment and then splice the partial results together to create a map of the aberration(s). Because the metrology is slightly off-axis, a model such as may be empirically derived, possibly including interpolation, and preferably in the form of a look-up table, to correlate the metrology results with actual performance and corrections appropriate to optimize performance.

It should be understood that the details of the metrology system are not important to the practice of the invention. The above discussion is provided to demonstrate, however, that relatively frequent measurement of aberrations during and between exposures to support dynamic correction as well as measurement of aberration on a less frequent basis for calibration, verification of adequate performance and the like are possible, even using the same apparatus, as may be accomplished by mounting metrology light source 110 and sensor 140 on retractable structures 150 in order to make both on-axis and off-axis measurements.

Once the aberrations of the system are determined from the aberrations detected by the off-axis (and/or on-axis) metrology system through, for example, modelling as depicted at 160, the appropriate corrections of the shape of any or all optical elements of the system may be determined from, for example, an empirically developed look-up table (LUT) 170 and corrections passed to a control arrangement 180, the details of which are unimportant to the practice of the invention, to control suitable arrangements for altering the shape of the adaptive optical elements.

While some different arrangements are known and have been designed in view of a wide range of possibly desirable attributes, the present invention seeks to provide the attributes of potentially high spatial frequency actuation while avoiding abrupt shape change of the optical surface, low cost per actuation channel and high stability while requiring little or no holding power. These attributes are desirable for the high accuracy, resolution and degree of freedom from aberrations, the ability to make minute adjustments of a small fraction of a very short wavelength which are selective to relatively minute regions of the optical element at a practical cost and high stability while having little or no hysteresis or mechanical memory which could cause an error in actual adjustment from an adjustment which is empirically derived or compromise repeatability or introduction of aberrations through, for example, local production of heat.

Figure 2:
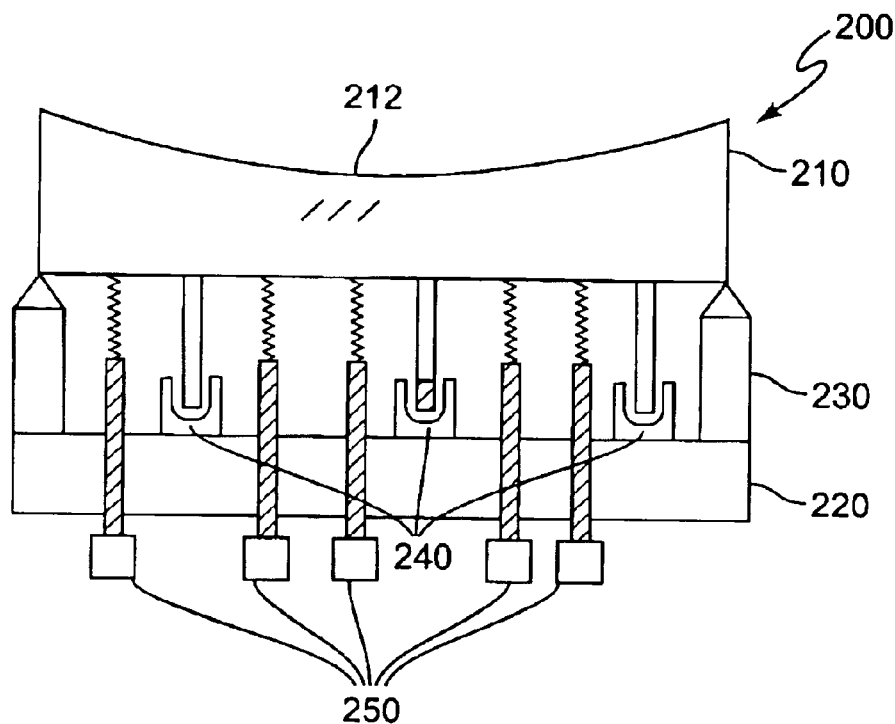
FIG. 2 is a cross-sectional view of an optical element of the system of FIG. 1 including active and passive actuators in accordance with a preferred embodiment of the invention.

As shown in cross-section in FIG. 2, an optical element 200 in accordance with the invention comprises a mirror 210 and a reaction plate 220 which carries mirror mounts 230 that affix the mirror to the reaction plate at a plurality of locations (preferably three to define the plane of the optical element) in a manner which ideally does not transfer stresses to the mirror. As illustrated and as alluded to above, the mirror 210 preferably has substantial thickness, stiffness and thermal mass although these parameters of design may be widely varied in accordance with the requirements of the optical system without departing from the basic principles of the invention.

Surface 212 of the mirror optical element 210 will ordinarily be formed very close to the ideal or intended shape. The current state of the art supports an accuracy to within a tolerance somewhat less than a wavelength in the EUV range but will still vary slightly from the ideal intended shape. However, that shape may be altered slightly under the influence of gravity, local or environmental temperature, mounting stresses and the like. Some components of error or variation in the shape may also result from operational conditions.

The inventor has found that components of such errors and alterations of shape are of two basic types: substantially steady state error components which are substantially constant (e.g. manufacturing variations, non-ideal mounting distortions and the like) or change only slowly (e.g. approaching a nominal thermal equilibrium), if at all, and higher frequency error components which may occur from exposure to exposure, wafer to wafer and the like, including variation over time from nominal equilibrium conditions. The term "higher frequency components" should be considered as being error components which have an operational dependency of the rate of change of the error component such as in general accordance with the interval of recharging the lithography tool with wafers to be exposed, the chip pattern exposure rate and the like or cyclical behavior of lower frequency.

The inventor has also found that steady state error components tend to be of a much larger magnitude than the higher frequency error components. Moreover, the inventor has found that the steady-state error components generally may have a higher order shape and may require correction at significantly higher spatial frequency than the higher frequency, operationally dependent components of shape error.

Returning now to FIG. 2, a plurality of actuators 240, 250 are shown, preferably located between the mirror supports 230 and arranged to contact the back side of mirror 210 at locations which may be placed in accordance with the spatial frequency of desired shape corrections which may be considered as being a relatively close and regular spacing, as shown. These actuators preferably include both active actuators 240 and passive actuators 250 which may be located in any pattern or array in order to correct errors which may be expected.

The passive actuators 250 are directed principally to correction of steady state components of shape error and are therefore preferably more numerous and closely spaced (e.g. with higher spatial frequency) than the active actuators 250 in order to provide higher order corrections which the inventor has found to be characteristic of steady state error components, as discussed above. The passive actuators may be simple manual adjustments since steady-state corrections generally need be made only infrequently or could be automated (e.g. robotically or with motors or the like). The active actuators may be of any type (e.g. mechanical such as robotically operated set screws, pneumatic such as inflatable bladders or bellows, electro-mechanical such as voice coil motors (VCM), bi-morph piezoelectric, piezostrictive or magnetostrictive devices or the like type of force actuators), preferably of relatively low stiffness. These active actuators are preferably located with relatively lower spatial frequency than the passive actuators.

Figure 3:
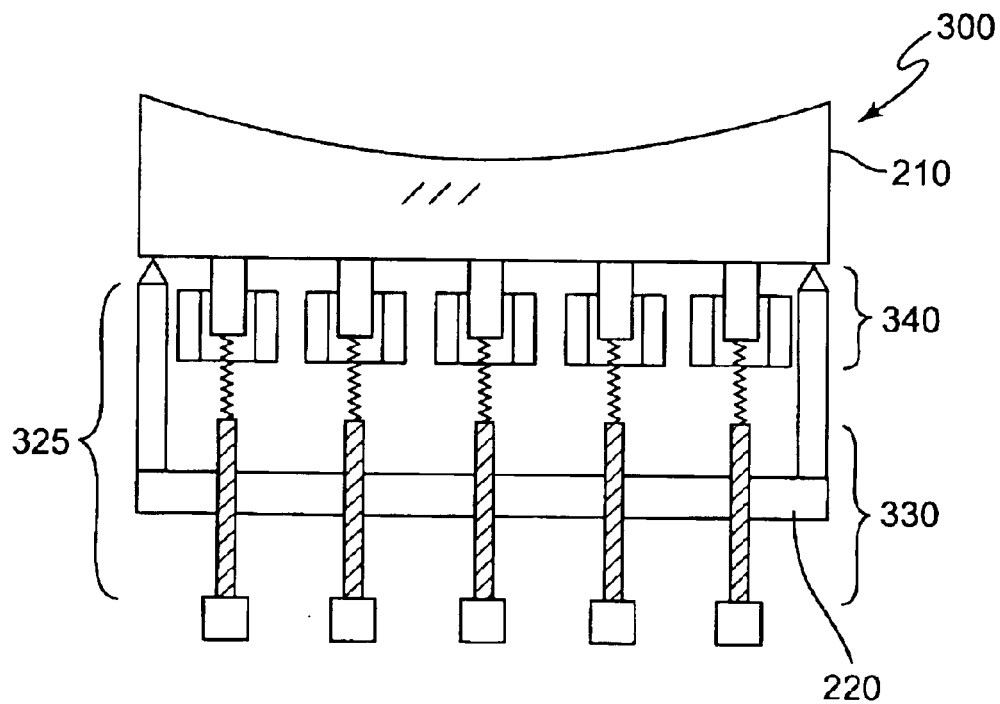
FIG. 3 is a cross-sectional view of an optical element of the system of FIG. 1 including combined passive and active actuators in accordance with and alternative and variant embodiment of FIG. 2.

The passive force actuators differ from known passive position actuators such as set screws by being constructed to apply an adjustable force which does not significantly vary with small variations in the (axial) position where a force is applied and may comprised, for example, by the combination of a soft spring of any form (e.g. coil, leaf, fixed pneumatic device, elastic body and the like type of mechanical link) with a position actuator such as a set screw, adjustable pneumatic device or the like, as illustrated in FIGS. 2 and 3. Such passive shape actuators have the property that changes in the shape of the mirror of minute dimensions will have little effect on the force applied by the soft spring (which has a relatively low or modulus of elasticity compared with said deformable mirror or an active or passive force or position actuator) while the active actuators are also force actuators and allow the force applied to the mirror to be adjusted to achieve the desired mirror shape. Both the active and passive actuators are preferably arranged to provide either compressive or tensile forces to the optical element although it is also possible to provide the optical element with a predistorted shape such that only compressive or tensile forces are require to achieve the desired shape. Thus, the use of a soft spring in combination with a position actuator provides compatibility with the active actuators which adjust force applied to the mirror while substantially decoupling correction of steady state error component correction from higher frequency, operationally dependent error component correction. The relative softness of the springs also provides a suitable spatial arrangement of the application of forces to the mirror to accommodate the high order nature of the steady-state error component corrections (since different forces can be applied with a high spatial frequency and potentially high gradients through the passive actuators but which can be adjusted at a lower spatial frequency by the active actuators.

An additional benefit of the arrangement of FIG. 2 is that the active actuators can be provided with greater spacing and need not carry the full load for correction of both steady-state and higher frequency, operationally dependent error component corrections but only the forces necessary for the latter. Therefore, the active actuators may be operated at much reduced power and are a much reduced source of heat due to both their reduced numbers of active actuators and the reduced power applied to each active actuator to achieve the required force. Further, the use of force actuators rather than position actuators for the passive actuators allows substantial decoupling of the steady-state error component corrections from each other since the force applied will not be changed significantly over deflections of the reactor plate which, in any event, can be held to minute dimensions but which may be significant when position actuators are employed.

Referring now to FIG. 3, an alternative, variant embodiment of the invention is shown in cross-section. The arrangement of mirror 210, reactor plate 220 and mirror mounts 230 are the same as those described above with reference to FIG. 2. This embodiment of the invention differs from that discussed above by the combining of passive actuators 330 with active actuators 340 as a compound actuator 325 at a single location. Active actuators can thus be provided at each location of a passive actuator, if desired or found necessary or useful, as illustrated, or the active/compound actuators 325 may be less frequently provided such as at locations corresponding to the active actuators 240 of FIG. 2 with passive actuators such as 250 of FIG. 2 interspersed therebetween.

Thus, at the expense of slightly increased complexity of the compound actuators 325 (which may be no greater than providing a mechanical force bias to an active actuator 240), active correction of higher frequency, operationally dependent error components can be provided at an arbitrarily high spatial frequency up to that of the passive actuators while no spatial interruption of the application of steady-state error component correction is required. Moreover, in most applications, the power required for the active actuators 340 will be even further reduced (since the force bias is directly applied thereto rather than averaged over adjacent passive actuators); allowing a somewhat increased spatial frequency thereof without increasing the heat developed thereby, as discussed above.

In view of the foregoing, it is seen that the above combination of active and passive actuators in accordance with the invention is particularly well-matched to the respective natures of steady-state error components and higher frequency, operationally dependent error component corrections, as recognized by the inventor, while minimizing power requirements and effects of heating by active actuators and allowing dynamic adjustment of respective optical elements of an optical system.

While the invention has been described in terms of a single preferred embodiment, those skilled in the art will recognize that the invention can be practiced with modification within the spirit and scope of the appended claims.

What is claimed is:

1. A dynamically adjustable optical element including, in combination,
    a reaction plate,
    a mirror spaced from said reaction plate,
    means for supporting said mirror relative to said reaction plate at a plurality of locations on said mirror, and
    a plurality of passive force actuators and a plurality of active force actuators arrayed across said reaction plate for applying forces between said reaction plate and said mirror.

2. A dynamically adjustable optical element as recited in claim 1, wherein one of said passive force actuators and said active force actuators includes a mechanical link having a low spring constant or modulus of elasticity.

3. A dynamically adjustable optical element as recited in claim 2, wherein said mechanical link is a spring.

4. A dynamically adjustable optical element as recited in claim 3, wherein said spring is a coil spring, leaf spring, fixed pneumatic device or an elastic body.

5. A dynamically adjustable optical element as recited in claim 1, wherein a said passive force actuator and a said active force actuator are combined into a compound actuator.

6. A dynamically adjustable optical element as recited in claim 1, wherein a said passive actuator includes a set screw or adjustable pneumatic device.

7. A dynamically adjustable optical element as recited in claim 1, wherein a said active actuator includes a robotically operated set screw, a pneumatic inflatable bladder or bellows, or a electromechanical voice coil motor or a bi-morph piezoelectric, piezostrictive or magnetostrictive device.

8. A dynamically adjustable optical element as recited in claim 1, wherein said passive force actuators are more closely spaced than said active force actuators.

9. A lens system including, in combination,
    means for measuring aberration of said lens system,
    an adaptive optical element,
    a reaction plate,
    a mirror mounted on but spaced from said reaction plate, and
    a plurality of passive force actuators and a plurality of active force actuators arrayed across said reaction plate for applying forces between said reaction plate and said mirror.

10. A lens system as recited in claim 9, wherein one of said passive force actuators and said passive force actuators include a mechanical link having a low spring constant or low modulus of elasticity.

11. A lens system as recited in claim 10, wherein said mechanical link is a spring.

12. A lens system as recited in claim 11, wherein said spring is a coil spring, leaf spring, fixed pneumatic device or an elastic body.

13. A lens system as recited in claim 9, wherein a said passive force actuator and a said active force actuator are combined into a compound actuator.

14. A lens system as recited in claim 9, wherein a said passive actuator includes a set screw or adjustable pneumatic device.

15. A lens system as recited in claim 9, wherein a said active actuator includes a robotically operated set screw, a pneumatic inflatable bladder or bellows, or a electromechanical voice coil motor or a bi-morph piezoelectric, piezostrictive or magnetostrictive device.

16. A lens system as recited in claim 9, wherein said passive force actuators are more closely spaced than said active force actuators.

17. A method of correcting aberrations of an adjustable optical element including steps of
    applying steady state forces to said adjustable optical element at a first spatial frequency, and
    applying dynamically adjustable forces to said adjustable optical element at a second spatial frequency, said first spatial frequency being greater than said second spatial frequency.

18. A method as recited in claim 17 wherein a said dynamically adjustable force is applied together with a said steady-state force.

* * * * *